(12) United States Patent
Huang et al.

(10) Patent No.: US 12,033,969 B2
(45) Date of Patent: *Jul. 9, 2024

(54) CHIP PACKAGE STRUCTURE

(71) Applicant: Taiwan Semiconductor Manufacturing Company, Ltd., Hsinchu (TW)

(72) Inventors: Kuan-Yu Huang, Taipei (TW); Sung-Hui Huang, Dongshan Township, Yilan County (TW); Shang-Yun Hou, Jubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/873,673

(22) Filed: Jul. 26, 2022

(65) Prior Publication Data

US 2022/0359448 A1    Nov. 10, 2022

Related U.S. Application Data

(63) Continuation of application No. 17/097,572, filed on Nov. 13, 2020, now Pat. No. 11,437,334, which is a
(Continued)

(51) Int. Cl.
*H01L 23/00* (2006.01)
*H01L 23/498* (2006.01)

(52) U.S. Cl.
CPC ........ *H01L 24/17* (2013.01); *H01L 23/49838* (2013.01); *H01L 24/05* (2013.01);
(Continued)

(58) Field of Classification Search
CPC ... H01L 24/17; H01L 23/49838; H01L 24/05; H01L 24/06; H01L 24/09; H01L 24/13; H01L 24/14; H01L 24/16; H01L 24/73; H01L 24/81; H01L 2224/0236; H01L 2224/02372; H01L 2224/05012; H01L 2224/05024; H01L 2224/0603; H01L 2224/06051; H01L 2224/0615;
(Continued)

(56) References Cited

U.S. PATENT DOCUMENTS 11,437,334 B2 *   9/2022   Huang ............... H01L 23/49838
2012/0012985 A1 * 1/2012   Shen ....................... H01L 24/16
                                                             438/455
(Continued)

*Primary Examiner* — Douglas W Owens
(74) *Attorney, Agent, or Firm* — Birch, Stewart, Kolasch & Birch, LLP

(57) ABSTRACT

A chip package structure is provided. The chip package structure includes a substrate. The chip package structure includes a chip over the substrate. The chip package structure includes a bump and a first dummy bump between the chip and the substrate. The bump is electrically connected between the chip and the substrate, the first dummy bump is electrically insulated from the substrate, and the first dummy bump is wider than the bump. The chip package structure includes a first dummy solder layer under the first dummy bump and having a curved bottom surface facing and spaced apart from the substrate.

20 Claims, 19 Drawing Sheets

Related U.S. Application Data continuation of application No. 16/424,125, filed on May 28, 2019, now Pat. No. 10,847,485.

(60) Provisional application No. 62/783,432, filed on Dec. 21, 2018.

(52) U.S. Cl.
CPC .............. *H01L 24/06* (2013.01); *H01L 24/09* (2013.01); *H01L 24/13* (2013.01); *H01L 24/14* (2013.01); *H01L 24/16* (2013.01); *H01L 24/73* (2013.01); *H01L 24/81* (2013.01); *H01L 2224/0236* (2013.01); *H01L 2224/02372* (2013.01); *H01L 2224/05012* (2013.01); *H01L 2224/05024* (2013.01); *H01L 2224/0603* (2013.01); *H01L 2224/06051* (2013.01); *H01L 2224/0615* (2013.01); *H01L 2224/06179* (2013.01); *H01L 2224/09181* (2013.01); *H01L 2224/09515* (2013.01); *H01L 2224/10126* (2013.01); *H01L 2224/13012* (2013.01); *H01L 2224/1357* (2013.01); *H01L 2224/1403* (2013.01); *H01L 2224/14051* (2013.01); *H01L 2224/1415* (2013.01); *H01L 2224/14179* (2013.01); *H01L 2224/14515* (2013.01); *H01L 2224/16148* (2013.01); *H01L 2224/16227* (2013.01); *H01L 2224/17104* (2013.01); *H01L 2224/1715* (2013.01); *H01L 2224/17181* (2013.01); *H01L 2224/17515* (2013.01); *H01L 2224/73204* (2013.01); *H01L 2224/81193* (2013.01); *H01L 2224/81815* (2013.01); *H01L 2224/8192* (2013.01); *H01L 2224/81986* (2013.01); *H01L 2924/3512* (2013.01)

(58) Field of Classification Search
CPC . H01L 2224/06179; H01L 2224/09181; H01L 2224/09515; H01L 2224/10126; H01L 2224/13012; H01L 2224/1357; H01L 2224/1403; H01L 2224/14051; H01L 2224/1415; H01L 2224/14179; H01L 2224/14515; H01L 2224/16148; H01L 2224/16227; H01L 2224/17104; H01L 2224/1715; H01L 2224/17181; H01L 2224/17515; H01L 2224/73204; H01L 2224/81193; H01L 2224/81815; H01L 2224/8192; H01L 2224/81986; H01L 2924/3512; H01L 23/3128; H01L 23/562; H01L 2224/13111; H01L 2224/13147; H01L 2224/16235; H01L 23/49822; H01L 23/147; H01L 2224/13082; H01L 2224/13124; H01L 2224/13155; H01L 2224/13157; H01L 2224/13184; H01L 2224/16238; H01L 2224/26125; H01L 2224/26155; H01L 2224/2919; H01L 2224/32225; H01L 2924/18161; H01L 23/49827; H01L 23/3121; H01L 21/561; H01L 23/488; H01L 24/10; H01L 24/11
See application file for complete search history.

(56) References Cited

U.S. PATENT DOCUMENTS

| | | |
|---|---|---|
| 2012/0049351 A1 | 3/2012 | Lee |
| 2015/0348930 A1 | 12/2015 | Jeong et al. |
| 2016/0190035 A1 | 6/2016 | Na et al. |
| 2021/0159207 A1 | 5/2021 | Derakhshandeh et al. |

* cited by examiner

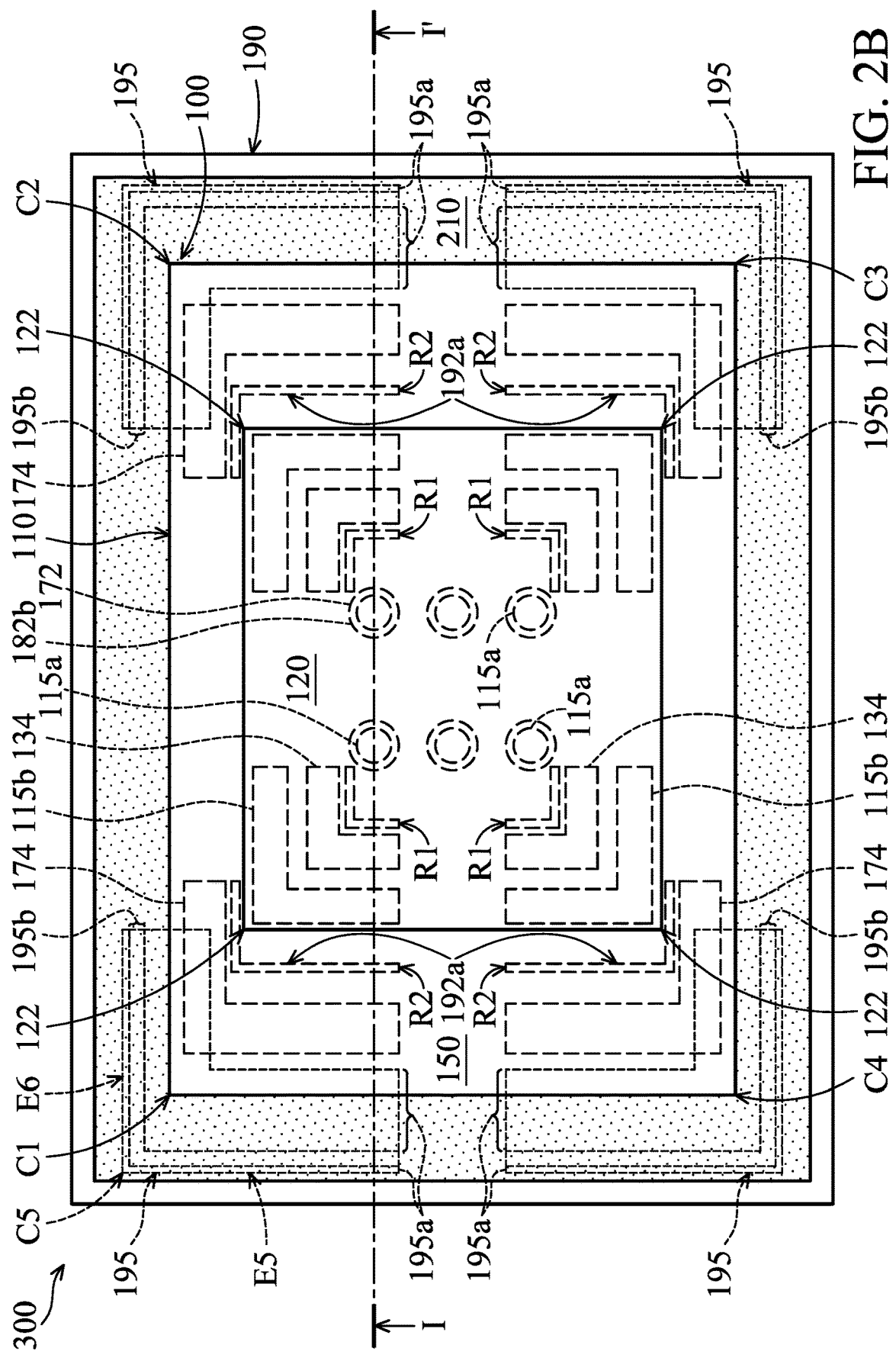

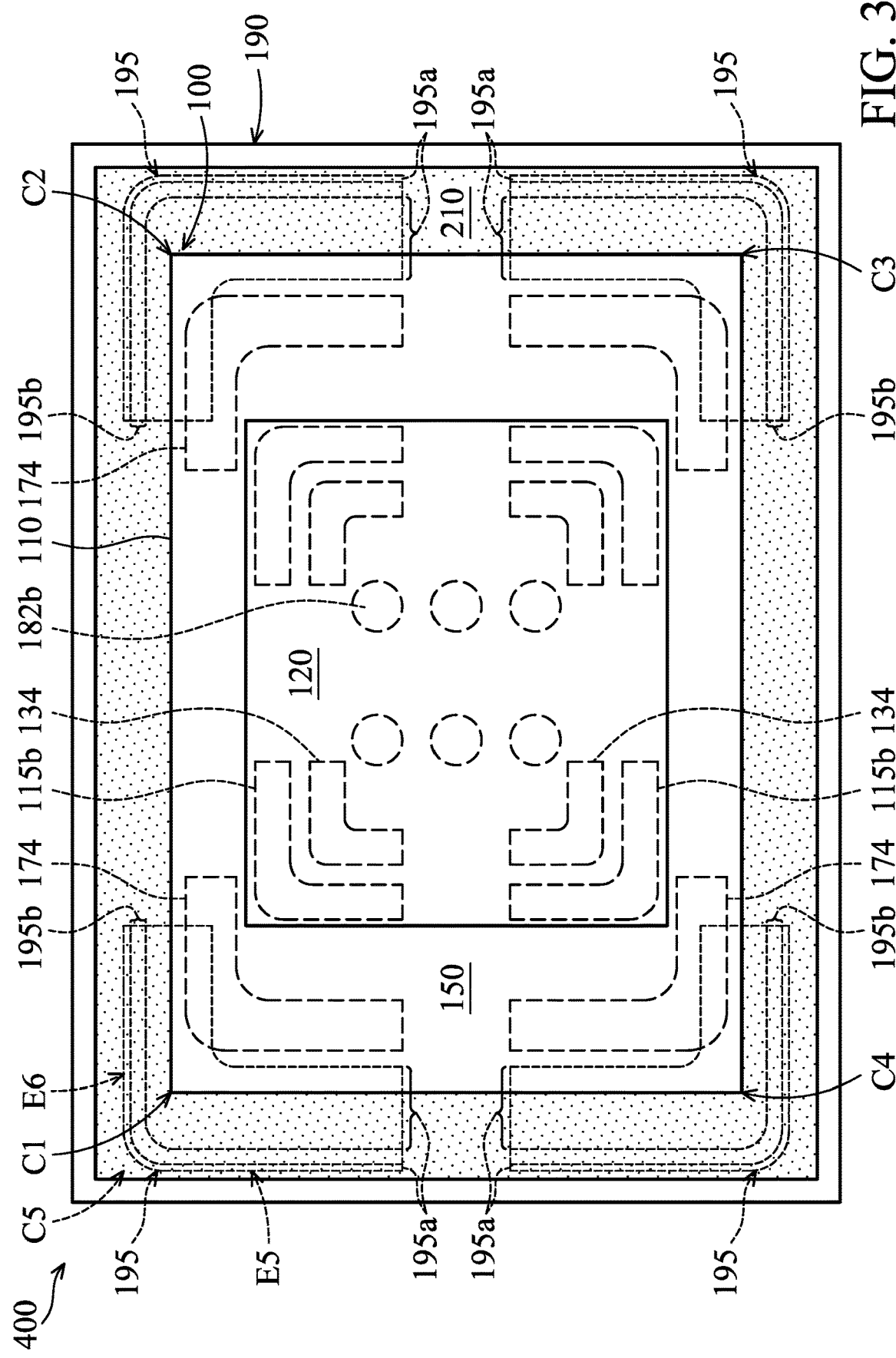

CHIP PACKAGE STRUCTURE

PRIORITY CLAIM AND CROSS-REFERENCE

This application is a Continuation of U.S. application Ser. No. 17/097,572, filed on Nov. 13, 2020, which is a Continuation of U.S. application Ser. No. 16/424,125, filed on May 28, 2019, which claims the benefit of U.S. Provisional Application No. 62/783,432, filed on Dec. 21, 2018, and entitled "CHIP PACKAGE WITH SEAL RING AND METHOD FOR FORMING THE SAME", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements.

Dozens or hundreds of integrated circuits are typically manufactured on a single semiconductor wafer. The individual dies are singulated by sawing the integrated circuits along scribe lines. The individual dies are then packaged separately. The semiconductor industry continues to improve the integration density of various electronic components (e.g., transistors, diodes, resistors, capacitors, etc.) by continual reductions in minimum feature size, which allow more components to be integrated into a given area. However, since feature sizes continue to decrease, fabrication processes continue to become more difficult to perform. Therefore, it is a challenge to form reliable packages with electronic components with high integration density.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a top view of a substrate of FIG. 1A, in accordance with some embodiments.

FIG. 1A-2 is a bottom view of a chip of FIG. 1A, in accordance with some embodiments.

FIG. 1B-1 is a top view of the chip package structure of FIG. 1B, in accordance with some embodiments.

FIG. 1D-1 is a top view of the chip package structure of FIG. 1D, in accordance with some embodiments.

FIG. 1F-1 is a top view of the chip package structure of FIG. 1F, in accordance with some embodiments.

FIG. 1G-1 is a top view of the chip package structure of FIG. 1G, in accordance with some embodiments.

FIG. 2B is a top view of the chip package structure of FIG. 2A, in accordance with some embodiments.

FIG. 3 is a top view of a chip package structure, in accordance with some embodiments.

DETAILED DESCRIPTION

Figure 1A:
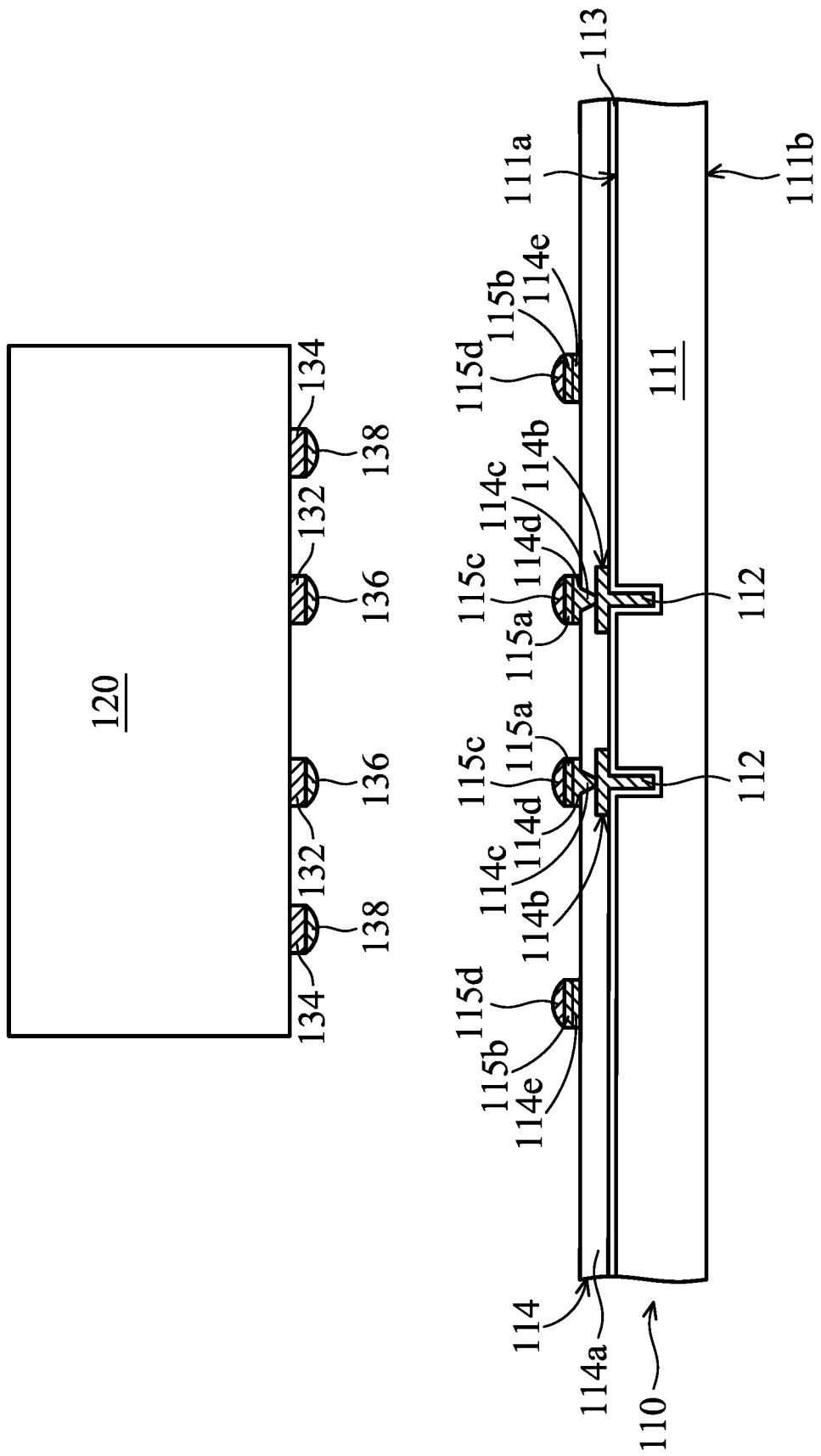
FIGS. 1A-1G are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figures 1, 1A:
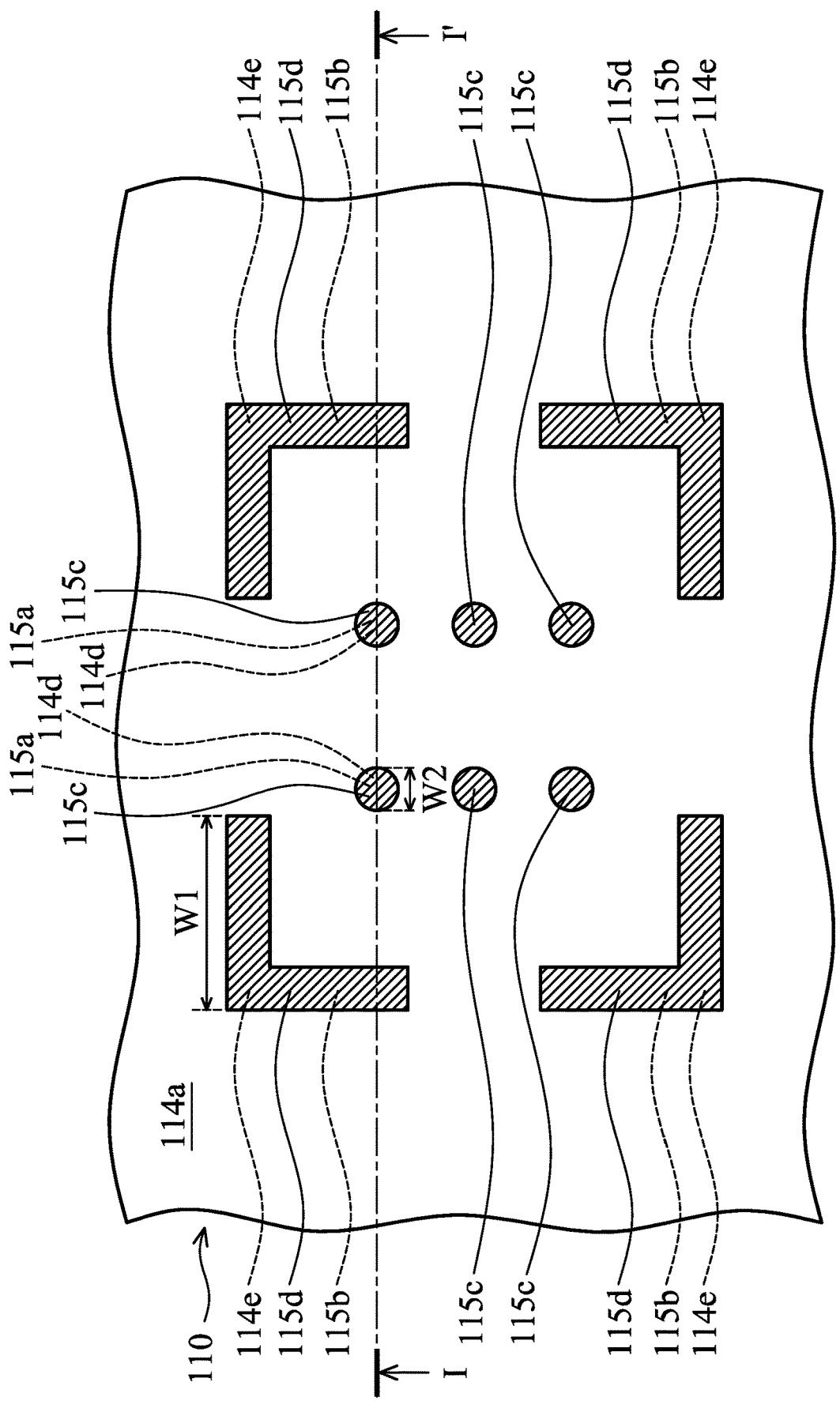
Figures 1, 1A, 2:
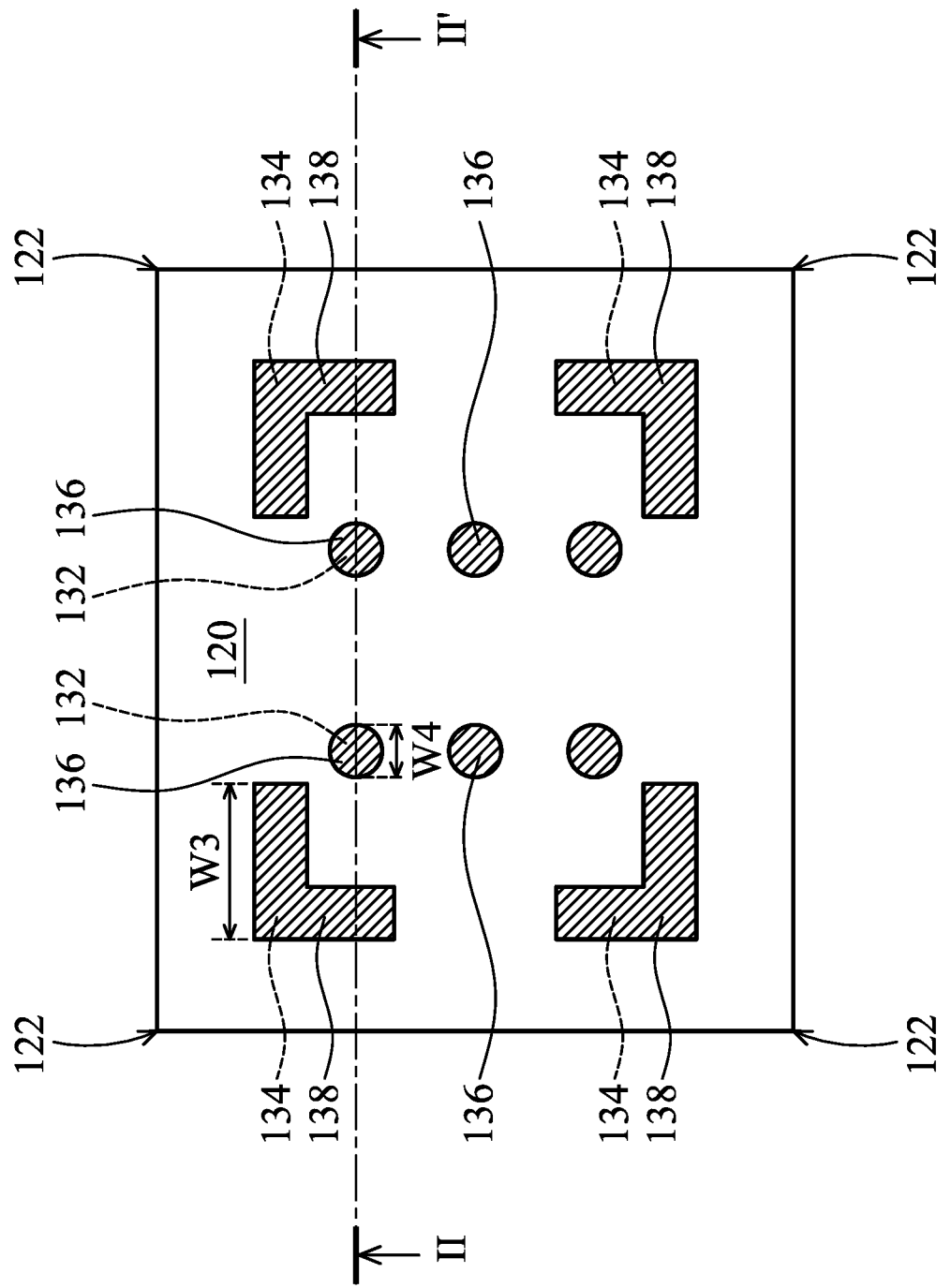

FIGS. 1A-1G are cross-sectional views of various stages of a process for forming a chip package structure, in accordance with some embodiments. FIG. 1A-1 is a top view of a substrate of FIG. 1A, in accordance with some embodiments. FIG. 1A-2 is a bottom view of a chip of FIG. 1A, in accordance with some embodiments. FIG. 1A is a cross-sectional view illustrating the substrate along a sectional line I-I' in FIG. 1A-1 and illustrating the chip along a sectional line II-II' in FIG. 1A-2, in accordance with some embodiments.

As shown in FIGS. 1A and 1A-1, a substrate 110 is provided, in accordance with some embodiments. In some embodiments, the substrate 110 is an interposer wafer. The substrate 110 includes a semiconductor structure 111, conductive vias 112, an insulating layer 113, and a redistribution structure 114, in accordance with some embodiments.

The semiconductor structure 111 has surfaces 111a and 111b, in accordance with some embodiments. In some embodiments, the semiconductor structure 111 is made of an elementary semiconductor material including silicon or germanium in a single crystal, polycrystal, or amorphous structure.

In some other embodiments, the semiconductor structure 111 is made of a compound semiconductor (e.g., silicon carbide, gallium arsenide, gallium phosphide, indium phosphide, or indium arsenide), an alloy semiconductor (e.g., SiGe or GaAsP), or a combination thereof. The semiconductor structure 111 may also include multi-layer semiconductors, semiconductor on insulator (SOI) (such as silicon on insulator or germanium on insulator), or a combination thereof.

The conductive vias 112 are formed in the semiconductor structure 111, in accordance with some embodiments. The conductive vias 112 may be formed to extend from the surface 111a into the semiconductor structure 111. The insulating layer 113 is formed over the semiconductor structure 111, in accordance with some embodiments. The insulating layer 113 is between the conductive vias 112 and the semiconductor structure 111, in accordance with some embodiments.

The insulating layer 113 is configured to electrically insulate the conductive vias 112 from the semiconductor structure 111, in accordance with some embodiments. The insulating layer 113 is made of an oxide-containing material such as silicon oxide, in accordance with some embodiments. The insulating layer 113 is formed using an oxidation process, a deposition process, or another suitable process.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at the surface 111a. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in the active regions. In some embodiments, the isolation features include shallow trench isolation (STI) features, local oxidation of silicon (LOCOS) features, other suitable isolation features, or a combination thereof.

The redistribution structure 114 is formed over the semiconductor structure 111, in accordance with some embodiments. The redistribution structure 114 includes a dielectric layer 114a, wiring layers 114b, conductive vias 114c, conductive pads 114d, and dummy pads 114e, in accordance with some embodiments. The dielectric layer 114a is formed over the surface 111a, in accordance with some embodiments. The wiring layers 114b are formed in the dielectric layer 114a, in accordance with some embodiments.

As shown in FIG. 1A, the conductive vias 114c are electrically connected between different wiring layers 114b and between the wiring layer 114b and the conductive pads 114d, in accordance with some embodiments. For the sake of simplicity, FIG. 1A only shows one of the wiring layers 114b, in accordance with some embodiments.

The conductive vias 112 are electrically connected to the conductive pads 114d through the wiring layers 114b and the conductive vias 114c, in accordance with some embodiments. The conductive pads 114d and the dummy pads 114e are formed over the dielectric layer 114a, in accordance with some embodiments. The dummy pads 114e are electrically insulated from the wiring layers 114b, in accordance with some embodiments.

As shown in FIGS. 1A and 1A-1, the dummy pads 114e surround the conductive pads 114d, in accordance with some embodiments. As shown in FIG. 1A-1, the dummy pads 114e have an L-like shape, in accordance with some embodiments. The wiring layers 114b, the conductive vias 114c, the conductive pads 114d, and the dummy pads 114e are made of a conductive material, such as copper (Cu), aluminum (Al), tungsten (W), cobalt (Co), nickel (Ni), or another suitable material, in accordance with some embodiments.

As shown in FIGS. 1A and 1A-1, bumps 115a and dummy bumps 115b are respectively formed over the conductive pads 114d and the dummy pads 114e, in accordance with some embodiments. As shown in FIG. 1A-1, the dummy bumps 115b have an L-like shape, in accordance with some embodiments.

As shown in FIG. 1A-1, the dummy bump 115b is wider than the bump 115a, in accordance with some embodiments. That is, a width W1 of the dummy bump 115b is greater than a width W2 of the bump 115a, in accordance with some embodiments. The bumps 115a and dummy bumps 115b are made of a conductive material, such as copper (Cu), aluminum (Al), tungsten (W), cobalt (Co), nickel (Ni), or another suitable material, in accordance with some embodiments.

As shown in FIGS. 1A and 1A-1, solder layers 115c and dummy solder layers 115d are respectively formed over the bumps 115a and the dummy bumps 115b, in accordance with some embodiments. The solder layers 115c and the dummy solder layers 115d are made of a conductive material, such as Tin (Sn) or another suitable material, in accordance with some embodiments.

As shown in FIGS. 1A and 1A-2, a chip 120 is provided, in accordance with some embodiments. The chip 120 includes a system on chip (SoC), in accordance with some embodiments. The chip 120 includes various device elements, in accordance with some embodiments. In some embodiments, the various device elements are formed in the chip 120.

The device elements are not shown in figures for the purpose of simplicity and clarity. Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the chip 120. The isolation features are used to define active regions and electrically isolate various device elements formed in the active regions. In some embodiments, the isolation features include shallow trench isolation (STI) features, local oxidation of silicon (LOCOS) features, other suitable isolation features, or a combination thereof.

As shown in FIGS. 1A and 1A-2, bumps 132 and dummy bumps 134 are formed over the chip 120, in accordance with some embodiments. The dummy bumps 134 are respectively close to corners 122 of the chip 120, in accordance with some embodiments. As shown in FIG. 1A-2, the dummy bump 134 is wider than the bump 132, in accordance with some embodiments. That is, a width W3 of the dummy bump 134 is greater than a width W4 of the bump 132, in accordance with some embodiments. As shown in FIG. 1A-2, the dummy bump 134 is between the bump 132 and the corner 122, in accordance with some embodiments. As shown in FIG. 1A-2, the dummy bumps 134 have an L-like shape, in accordance with some embodiments.

As shown in FIGS. 1A and 1A-2, solder layers 136 and dummy solder layers 138 are respectively formed over the bumps 132 and the dummy bumps 134, in accordance with some embodiments. The solder layers 136 and the dummy solder layers 138 are made of a conductive material, such as Tin (Sn) or another suitable material, in accordance with some embodiments.

Figure 1B:
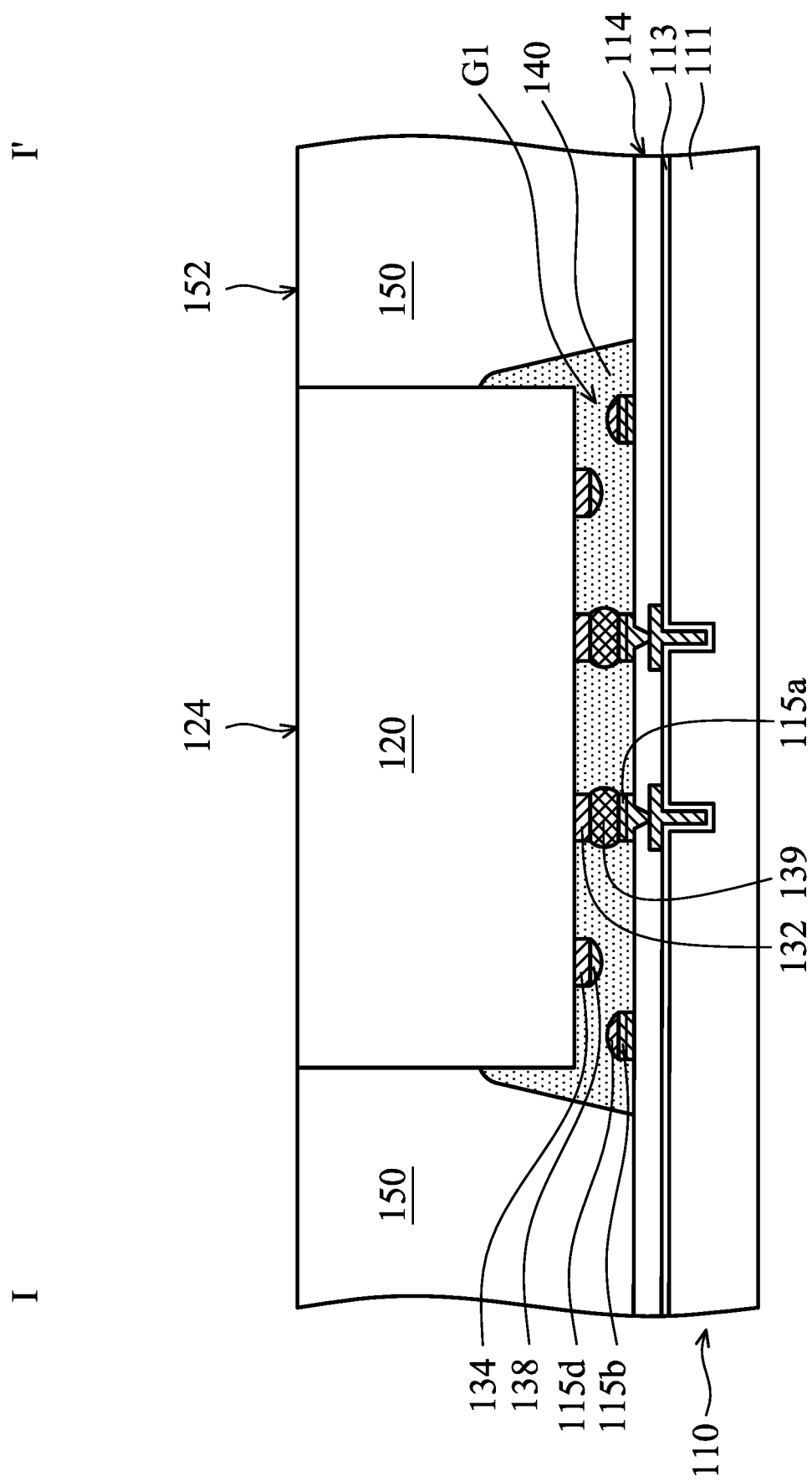
Figures 1, 1B:
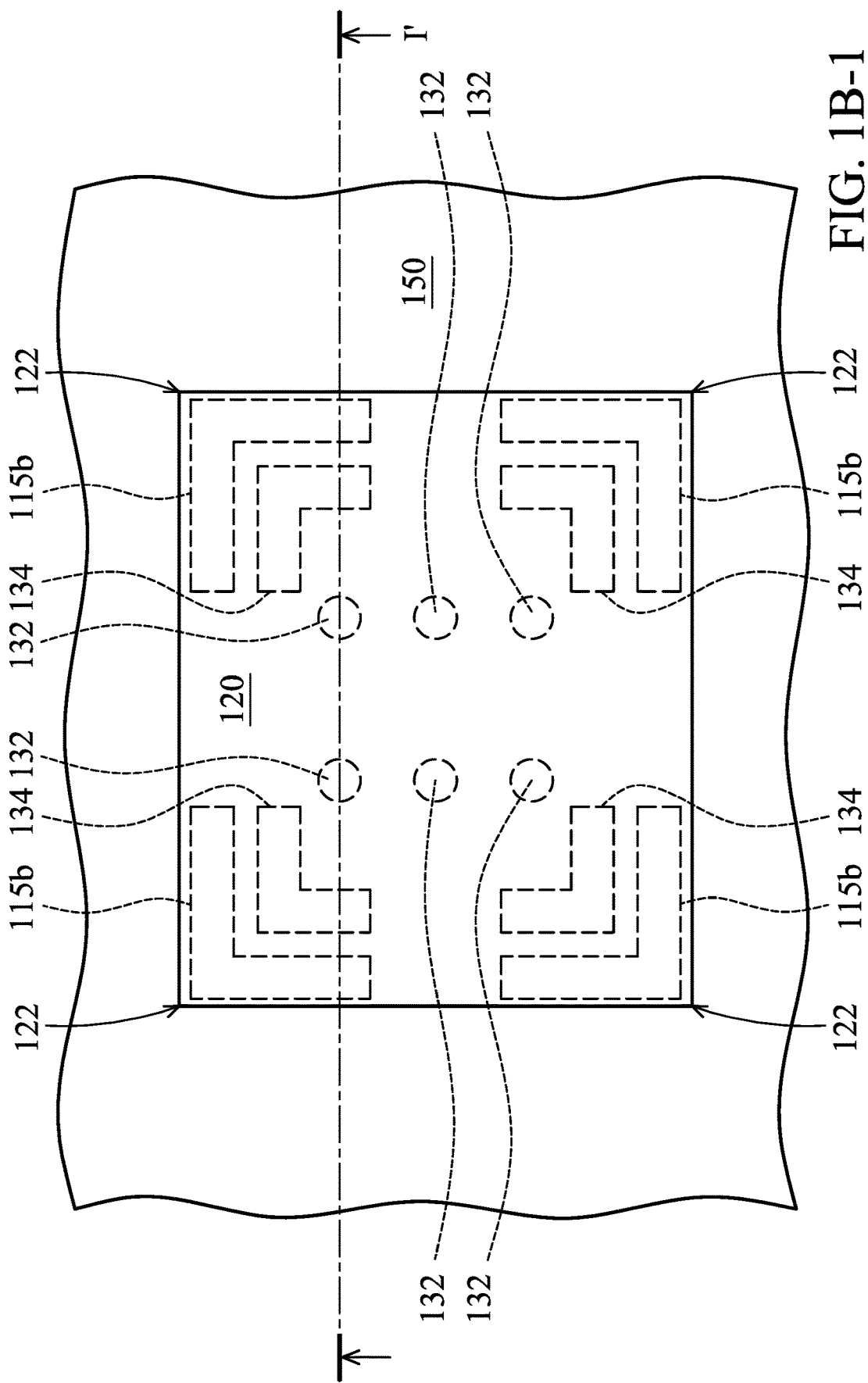

FIG. 1B-1 is a top view of the chip package structure of FIG. 1B, in accordance with some embodiments. FIG. 1B is a cross-sectional view illustrating the chip package structure along a sectional line I-I' in FIG. 1B-1, in accordance with some embodiments. As shown in FIGS. 1B and 1B-1, the chip 120 is disposed over the substrate 110, in accordance with some embodiments. Thereafter, a reflow process is performed over the solder layers 136 and 115c, in accordance with some embodiments.

After the reflow process, each solder layer 136 and the solder layer 115c thereunder melt and mix together to form a solder ball 139, in accordance with some embodiments. Therefore, the chip 120 is bonded to the substrate 110 through the bumps 132 and 115a and the solder balls 139, in accordance with some embodiments.

After the chip 120 is bonded to the substrate 110, the dummy bumps 115b and 134 and the dummy solder layers 115d and 138 are between the chip 120 and the substrate 110, in accordance with some embodiments. The dummy bumps 134 and the dummy solder layers 138 are electrically insulated from the substrate 110, in accordance with some embodiments. The dummy bumps 115b and the dummy solder layers 115d are electrically insulated from the chip 120, in accordance with some embodiments.

The dummy bumps 115b are respectively close to the corners 122 of the chip 120, in accordance with some embodiments. The dummy bump 115b is wider than the bump 132, in accordance with some embodiments. In some embodiments (such as those illustrated in FIG. 1B-1), the dummy bumps 115b and 134 have the same shape, in accordance with some embodiments. The dummy bumps 115b surround the dummy bumps 134, in accordance with some embodiments. As shown in FIG. 1B-1, the dummy bump 115b is between the corner 122 and the dummy bump 134, in accordance with some embodiments.

As shown in FIG. 1B, an underfill layer 140 is formed into a gap G1 between the substrate 110 and the chip 120, in accordance with some embodiments. The underfill layer 140 is also referred to as a protective layer, in accordance with some embodiments. The underfill layer 140 surrounds the bumps 132 and 115a, the solder balls 139, and the chip 120, in accordance with some embodiments. The underfill layer 140 is partially between the dummy bumps 134 (or the dummy solder layers 138) and the substrate 110, in accordance with some embodiments.

The underfill layer 140 is partially between the dummy bumps 115b (or the dummy solder layers 115d) and the chip 120, in accordance with some embodiments. The underfill layer 140 is partially between the dummy bumps 134 and 115b, in accordance with some embodiments. The underfill layer 140 is partially between the dummy solder layers 138 and 115d, in accordance with some embodiments. The underfill layer 140 includes a polymer material, in accordance with some embodiments.

Since the stress tends to concentrate at the corners 122 of the chip 120 and tends to induce cracks in the underfill layer 140 closed to the corners 122, the dummy bumps 134 and 115b and the dummy solder layers 138 and 115d are closed to the corners 122 and are able to stop the cracks, in accordance with some embodiments. Therefore, the dummy bumps 134 and 115b and the dummy solder layers 138 and 115d prevent the bumps 132 and 115a and the solder balls 139 from damage resulting from cracks induced by the stress concentrating at the corners 122, in accordance with some embodiments. As a result, the dummy bumps 134 and 115b and the dummy solder layers 138 and 115d improve the yield of the bumps 132 and 115a and the solder balls 139, in accordance with some embodiments.

As shown in FIGS. 1B and 1B-1, a molding layer 150 is formed over the substrate 110, in accordance with some embodiments. The molding layer 150 surrounds the chip 120, the underfill layer 140, the bumps 132 and 115a, and the solder balls 139, in accordance with some embodiments. The molding layer 150 includes a polymer material, in accordance with some embodiments. The top surface 124 and 152 of the chip 120 and the molding layer 150 are substantially coplanar, in accordance with some embodiments.

Figure 1C:
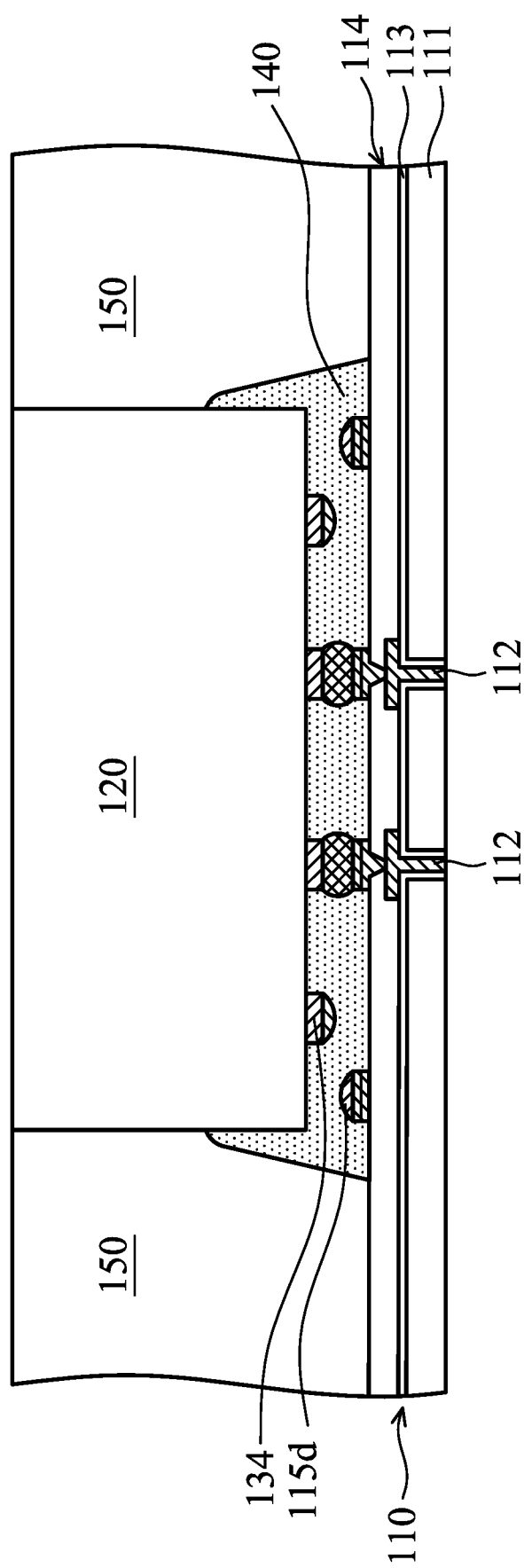

As shown in FIG. 1C, a lower portion of the semiconductor structure 111 is removed, in accordance with some embodiments. The removal process includes a chemical mechanical polishing (CMP) process, in accordance with some embodiments. After the removal process, the conductive vias 112 and the insulating layer 113 are exposed, in accordance with some embodiments.

The conductive vias 112 and the insulating layer 113 pass through the semiconductor structure 111, in accordance with some embodiments. The conductive vias 112 are also referred to as through-substrate vias or through-silicon vias when the semiconductor structure 111 is a silicon substrate, in accordance with some embodiments.

Figure 1D:
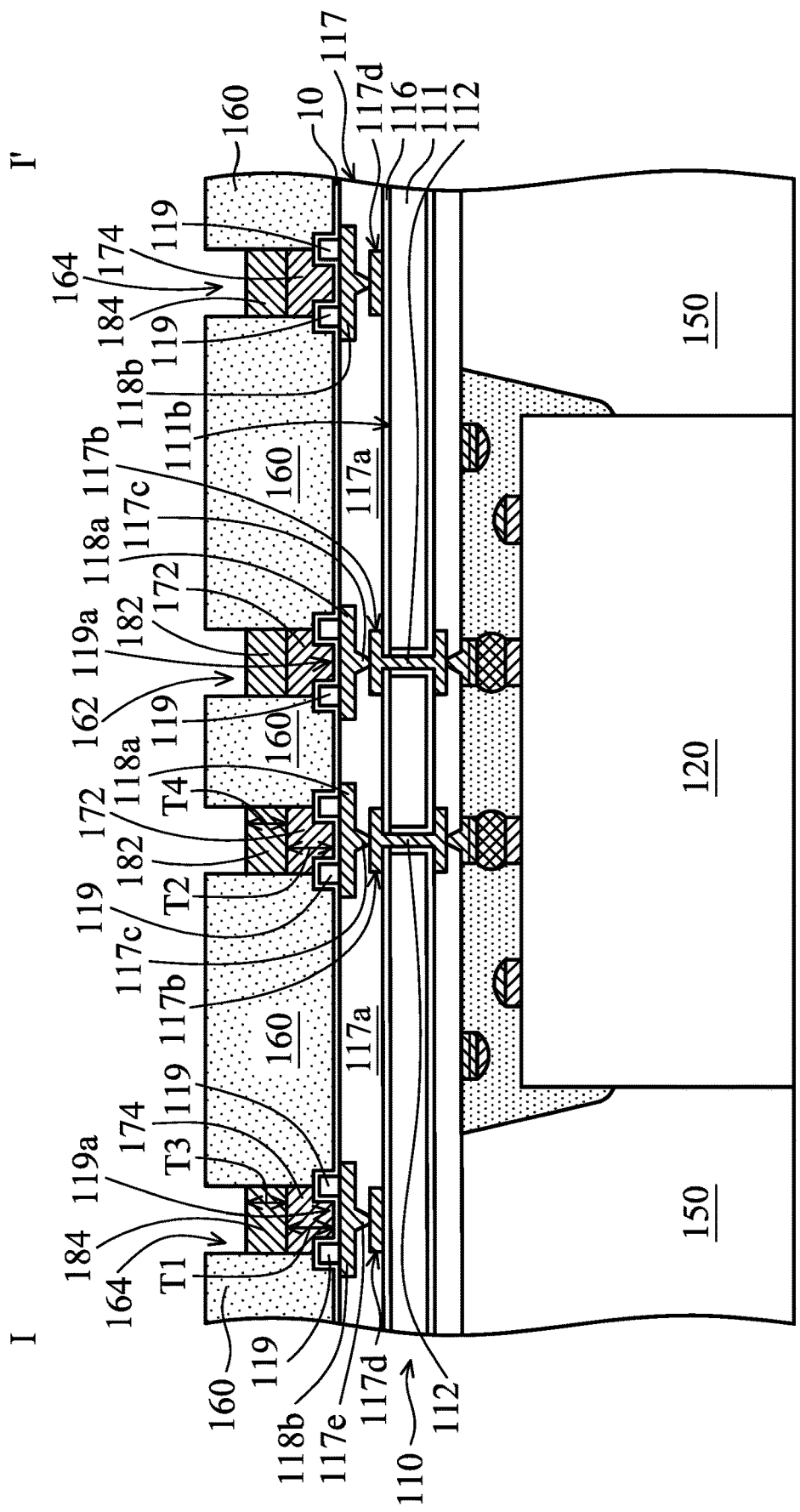
Figures 1, 1D:
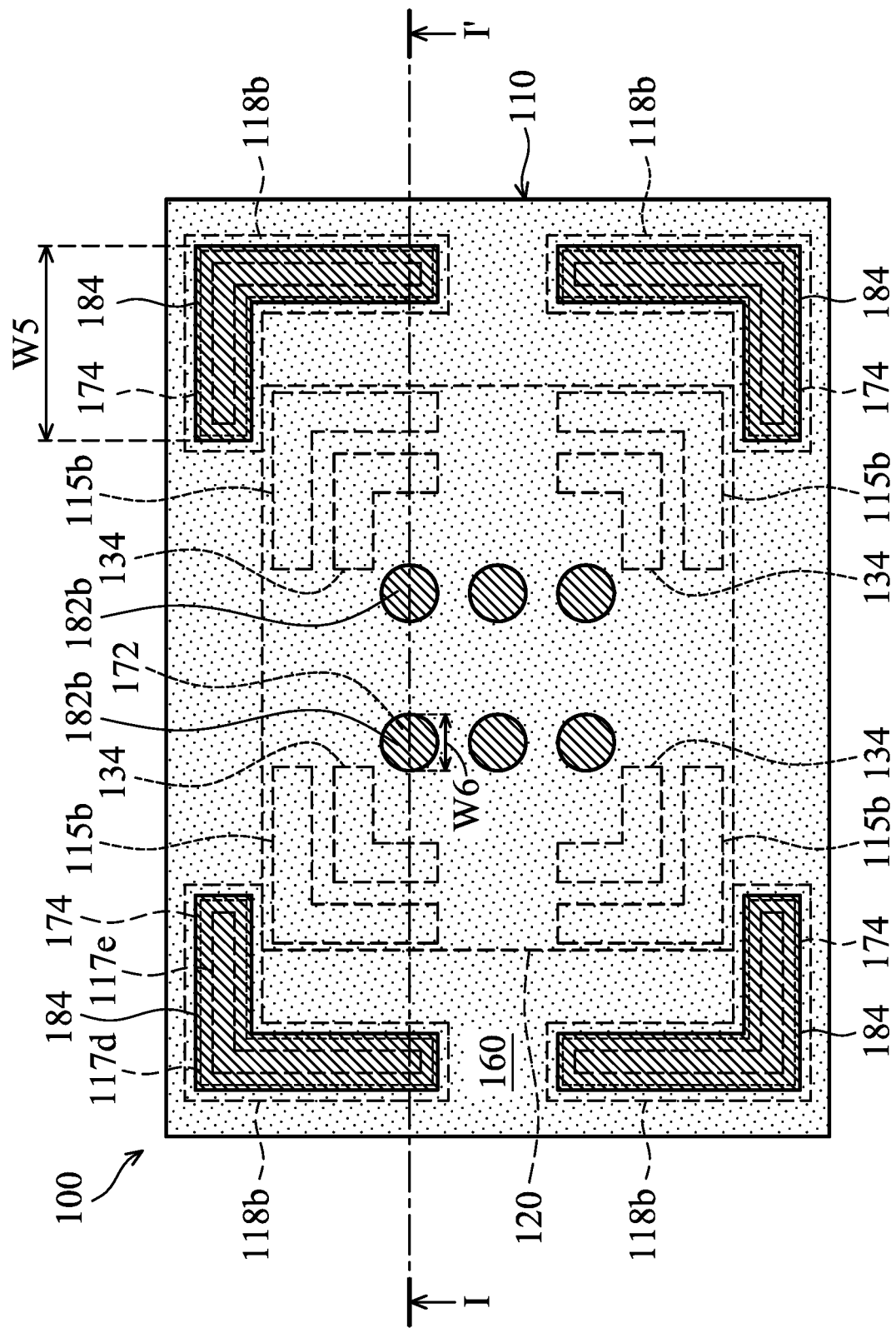

FIG. 1D-1 is a top view of the chip package structure of FIG. 1D, in accordance with some embodiments. FIG. 1D is a cross-sectional view illustrating the chip package structure along a sectional line I-I' in FIG. 1D-1, in accordance with some embodiments.

As shown in FIGS. 1D and 1D-1, the semiconductor structure 111 is flipped upside down, in accordance with some embodiments. As shown in FIG. 1D, an insulating layer 116 is formed over the surface 111b, in accordance with some embodiments. The insulating layer 116 is configured to electrically insulate wiring layers subsequently formed thereon from the semiconductor structure 111, in accordance with some embodiments. The insulating layer 116 is made of an oxide-containing material such as silicon oxide, in accordance with some embodiments. The insulating layer 116 is formed using an oxidation process, a deposition process, or another suitable process.

In some embodiments, a redistribution structure 117 is formed over the surface 111b of the semiconductor structure 111, in accordance with some embodiments. The redistribution structure 117 includes a dielectric layer 117a, wiring layers 117b, conductive vias 117c, dummy lines 117d, and dummy vias 117e, in accordance with some embodiments. The wiring layers 117b, the conductive vias 117c, the dummy lines 117d, and the dummy vias 117e are formed in the dielectric layer 117a, in accordance with some embodiments.

As shown in FIG. 1D, pads 118a and dummy pads 118b are formed over the redistribution structure 117, in accordance with some embodiments. The conductive vias 117c are electrically connected between different wiring layers 117b and between the wiring layer 117b and the conductive pads 118a, in accordance with some embodiments. For the sake of simplicity, FIG. 1D only shows one of the wiring layers 117b, in accordance with some embodiments.

The conductive vias 112 are electrically connected to the conductive pads 118a through the wiring layers 117b and the conductive vias 117c, in accordance with some embodiments. The dummy vias 117e are connected between the dummy pads 118b and the dummy lines 117d, in accordance with some embodiments.

As shown in FIG. 1D, buffer rings 119 are formed over the pads 118a and the dummy pads 118b, in accordance with some embodiments. The buffer ring 119 has an opening 119a exposing the conductive pad 118a or 118b thereunder, in accordance with some embodiments. The buffer rings 119 are configured to buffer the stress between the substrate 110 and bumps subsequently formed thereover, in accordance with some embodiments.

The buffer rings 119 are made of an elastic material such as a polymer material (e.g., polyimide), in accordance with some embodiments. In some other embodiments (not shown), the buffer rings 119 are replaced with a buffer layer having openings exposing the pads 118a and the dummy pads 118b.

As shown in FIG. 1D, a seed layer 10 is formed over the redistribution structure 117, the buffer rings 119, the pads 118a, and the dummy pads 118b, in accordance with some embodiments. The materials of the seed layer 10 may include copper or copper alloys. The materials of the seed layer 10 may include other metals, such as silver, gold, aluminum, and combinations thereof.

As shown in FIG. 1D, a mask layer 160 is formed over the seed layer 10, in accordance with some embodiments. The mask layer 160 has openings 162 and 164 exposing the seed layer 10 over the pads 118a and the dummy pads 118b and the buffer rings 119 adjacent to the pads 118a and the dummy pads 118b, in accordance with some embodiments. The mask layer 160 is made of a polymer material such as a photoresist material, in accordance with some embodiments.

As shown in FIG. 1D, bumps 172 and dummy bumps 174 are respectively formed in the openings 162 and 164 and over the pads 118a and the dummy pads 118b, in accordance with some embodiments. In some embodiments, the bumps 172 are electrically connected to the chip 120 through the substrate 110. In some embodiments, the dummy bumps 174 are electrically insulated from the chip 120. In some embodiments, a thickness T1 of the dummy bump 174 is less than or equal to a thickness T2 of the bump 172, in accordance with some embodiments.

As shown in FIGS. 1D and 1D-1, the dummy bump 174 is wider than the bump 172, in accordance with some embodiments. That is, a width W5 of the dummy bump 174 is greater than a width W6 of the bump 172, in accordance with some embodiments. The dummy bumps 174 have an L-like shape, in accordance with some embodiments.

The dummy bumps 174 are electrically insulated from the chip 120, in accordance with some embodiments. In some embodiments (such as those illustrated in FIG. 1D-1), the dummy bumps 174, the dummy pads 118b, the dummy vias 117e, and the dummy lines 117d have a substantially same shape (e.g. an L-like shape).

The bumps 172 and the dummy bumps 174 are made of a conductive material such as copper (Cu), aluminum (Al), tungsten (W), cobalt (Co), or nickel (Ni), in accordance with some embodiments. The bumps 172 and the dummy bumps 174 are formed using a plating process such as an electroplating process, in accordance with some embodiments.

As shown in FIG. 1D, a solder layer 182 and a dummy solder layer 184 are respectively formed over the bumps 172 and the dummy bumps 174, in accordance with some embodiments. In some embodiments, a thickness T3 of the dummy solder layer 184 is less than or equal to a thickness T4 of the solder layer 182, in accordance with some embodiments.

The solder layer 182 and the dummy solder layer 184 is made of tin (Sn) or another suitable conductive material with a melting point lower than that of the bumps 172 and the dummy bumps 174, in accordance with some embodiments. The solder layer 182 and the dummy solder layer 184 are formed using a plating process such as an electroplating process, in accordance with some embodiments.

Figure 1E:
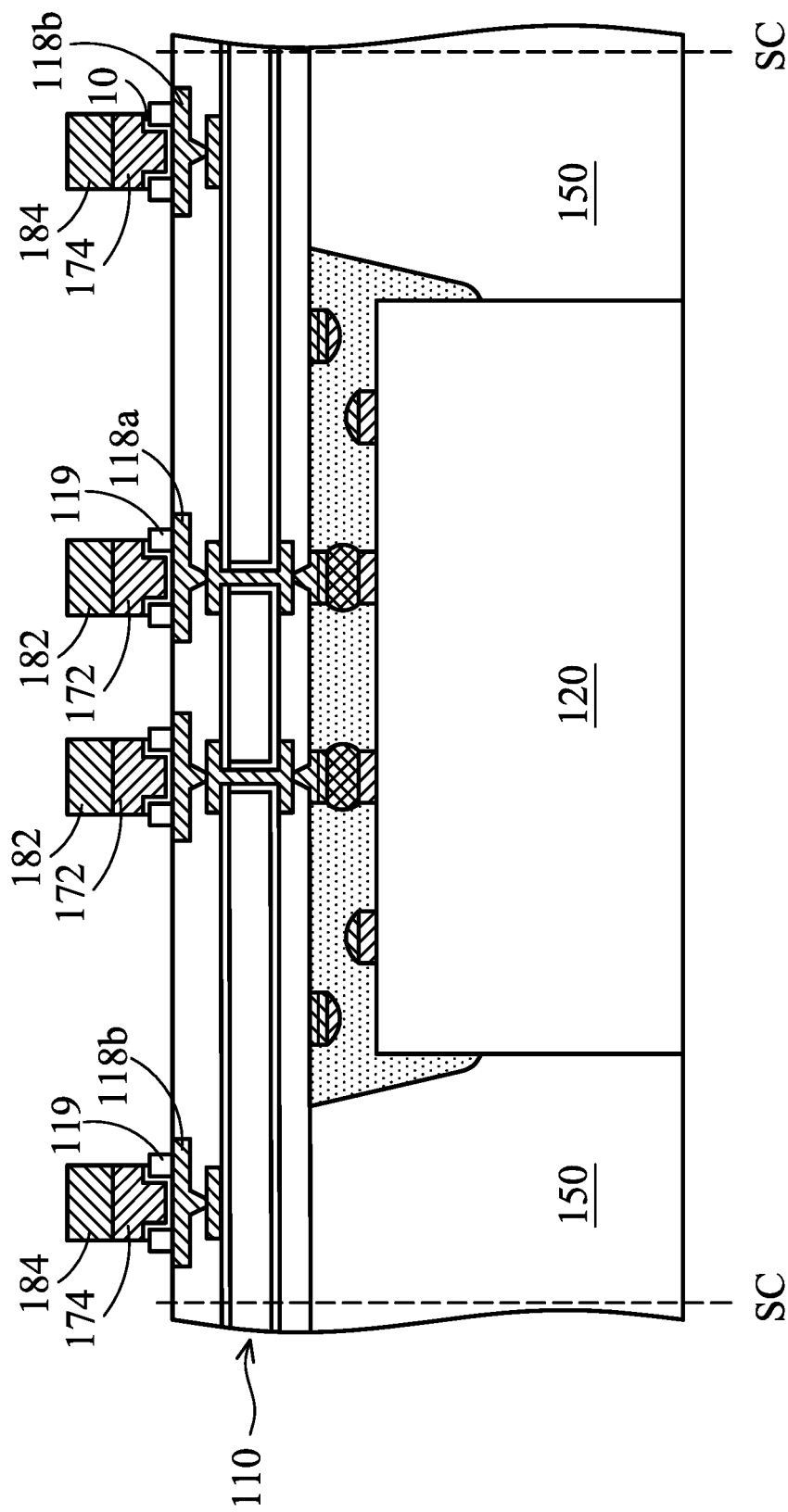

As shown in FIG. 1E, the mask layer 160 is removed, in accordance with some embodiments. As shown in FIG. 1E, the seed layer 10 originally covered by the mask layer 160 is removed, in accordance with some embodiments. The seed layer 10 is removed using an etching process, in accordance with some embodiments.

Figure 1F:
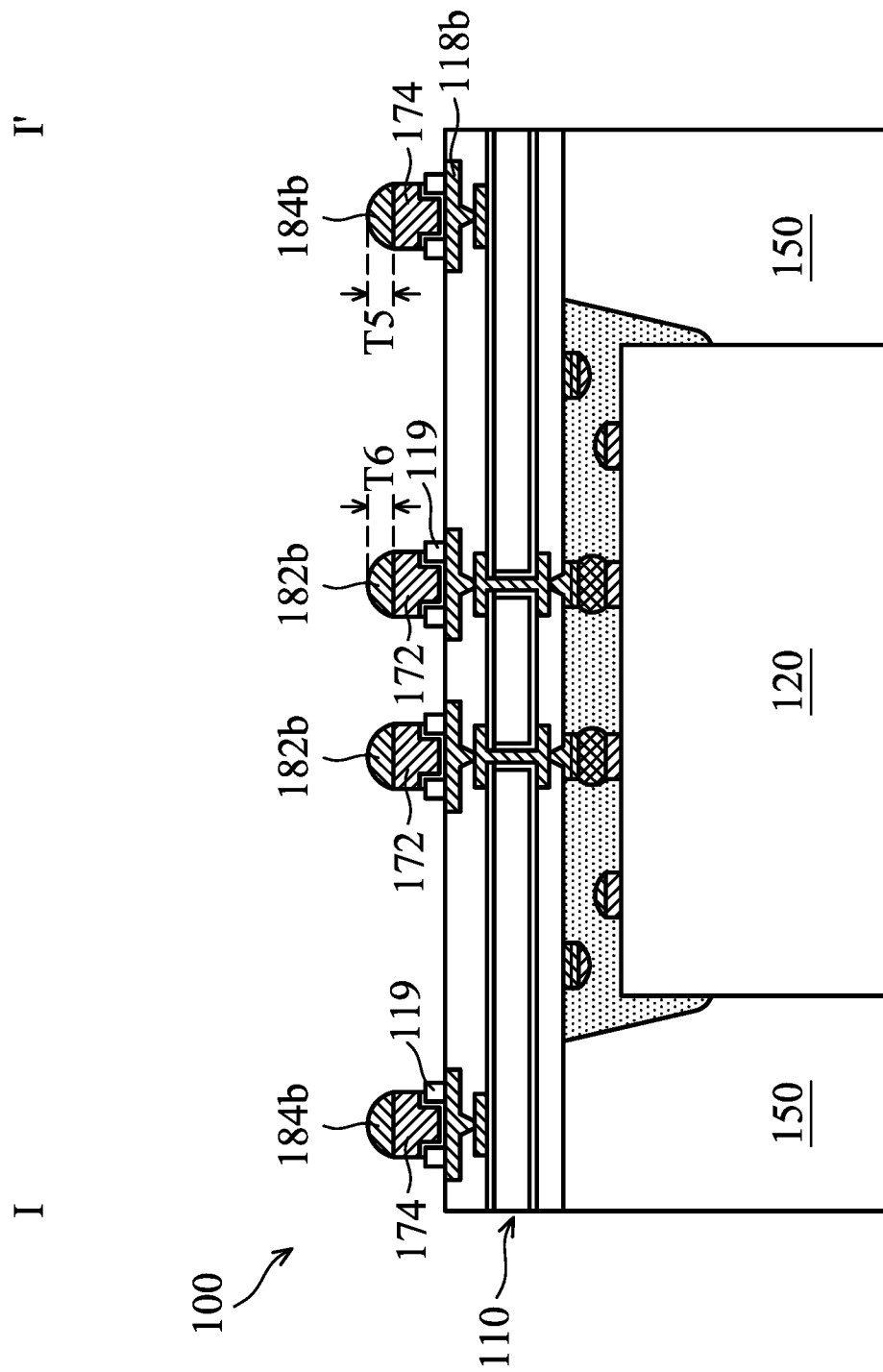
Figures 1, 1F:
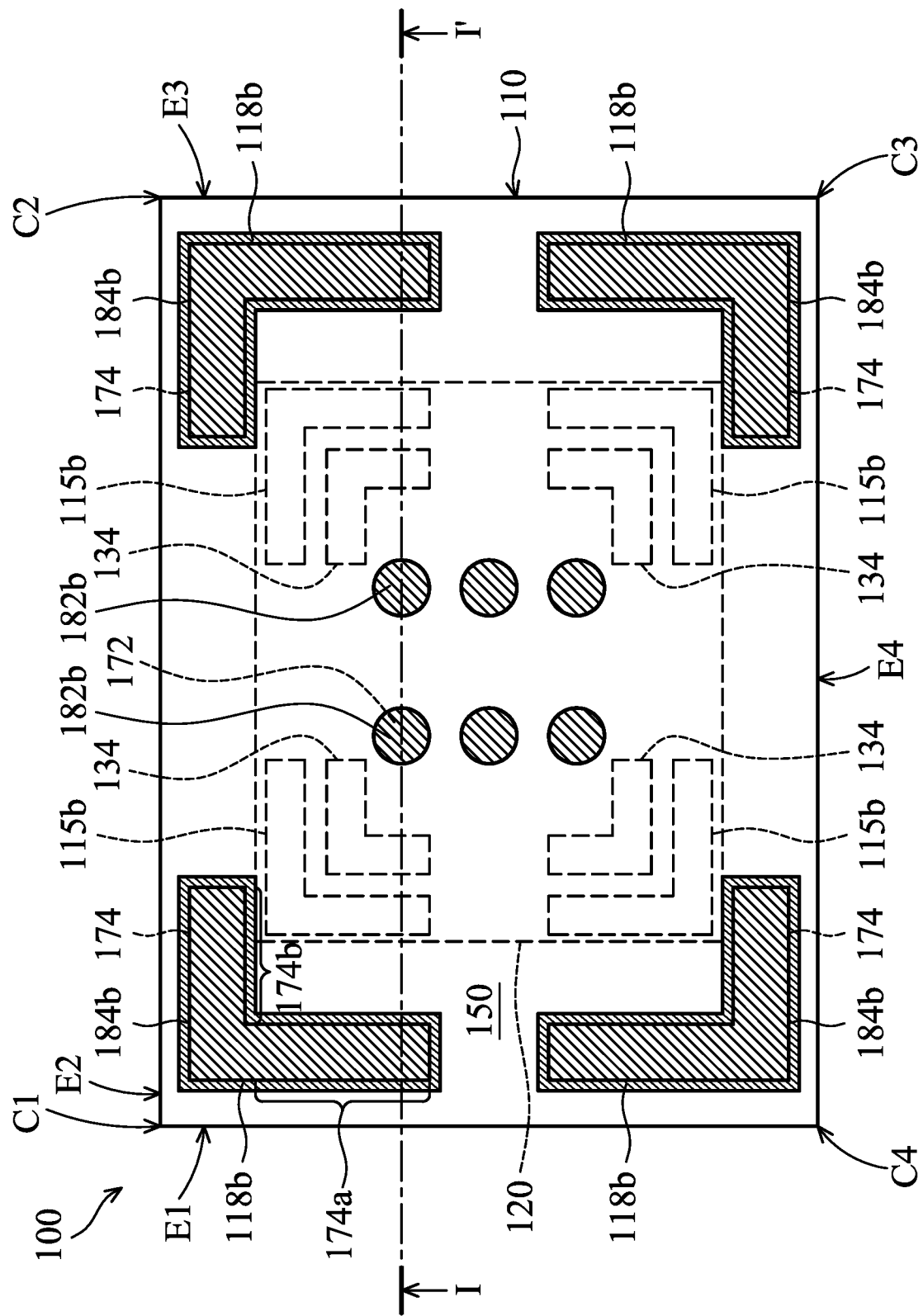

FIG. 1F-1 is a top view of the chip package structure of FIG. 1F, in accordance with some embodiments. FIG. 1F is a cross-sectional view illustrating the chip package structure along a sectional line I-I' in FIG. 1F-1, in accordance with some embodiments. For the sake of simplicity, FIG. 1F-1 does not show the buffer rings 119, in accordance with some embodiments.

As shown in FIGS. 1E, 1F and 1F-1, a reflow process is performed over the solder layers 182 and the dummy solder layers 184 to convert the solder layers 182 and the dummy solder layers 184 into solder balls 182b and dummy solder balls 184b, in accordance with some embodiments. In some embodiments, a thickness T5 of the dummy solder ball 184b is less than or equal to a thickness T6 of the solder ball 182b.

As shown in FIGS. 1E, 1F and 1F-1, a cutting process is performed to cut through the substrate 110 and the molding layer 150 along predetermined scribe lines SC to form chip package structures 100, in accordance with some embodiments. As shown in FIG. 1F-1, the substrate 110 has edges E1, E2, E3, and E4, in accordance with some embodiments.

The edges E1 and E2 meet at a corner C1 of the substrate 110, in accordance with some embodiments. The edges E2 and E3 meet at a corner C2 of the substrate 110, in accordance with some embodiments. The edges E3 and E4 meet at a corner C3 of the substrate 110, in accordance with some embodiments. The edges E4 and E1 meet at a corner C4 of the substrate 110, in accordance with some embodiments. The dummy bumps 174 are respectively close to the corners C1, C2, C3, and C4, in accordance with some embodiments.

The dummy bump 174 close to the corner C1 has strip portions 174a and 174b, in accordance with some embodiments. The strip portion 174a is substantially parallel to the edge E1, in accordance with some embodiments. That is, the distance between the strip portion 174a and the edge E1 is substantially uniform, in accordance with some embodiments. The term "substantially parallel" in the application may include small deviations from parallel geometries. The deviations may be due to manufacturing processes. The strip portion 174b is substantially parallel to the edge E2, in accordance with some embodiments.

The dummy bump 174 close to the corner C1 is between the bump 172 and the corner C1, in accordance with some embodiments. The dummy bump 174 close to the corner C2 is between the bump 172 and the corner C2, in accordance with some embodiments. The dummy bump 174 close to the corner C3 is between the bump 172 and the corner C3, in accordance with some embodiments. The dummy bump 174 close to the corner C4 is between the bump 172 and the corner C4, in accordance with some embodiments.

Figure 1G:
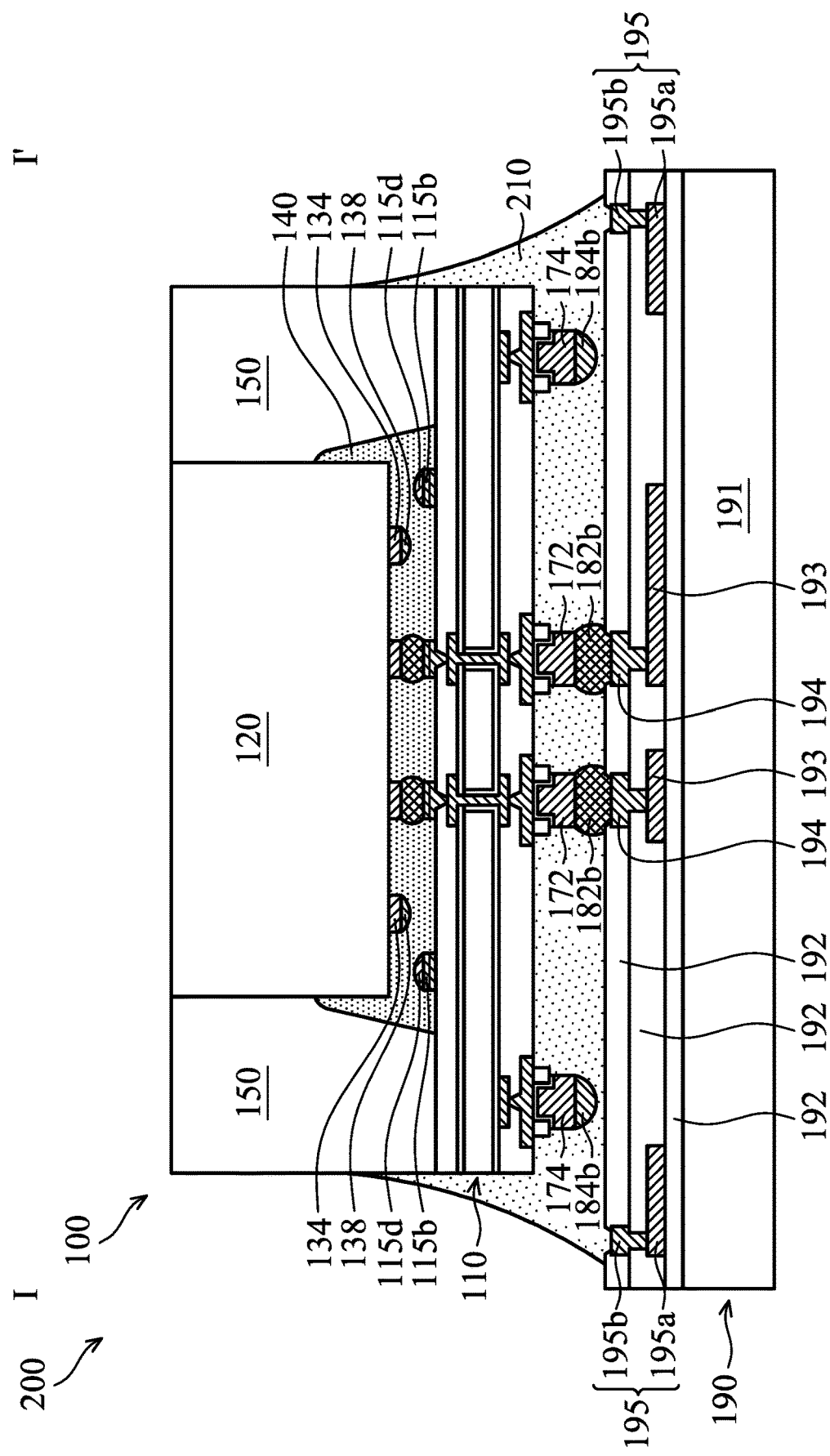
Figures 1, 1G:
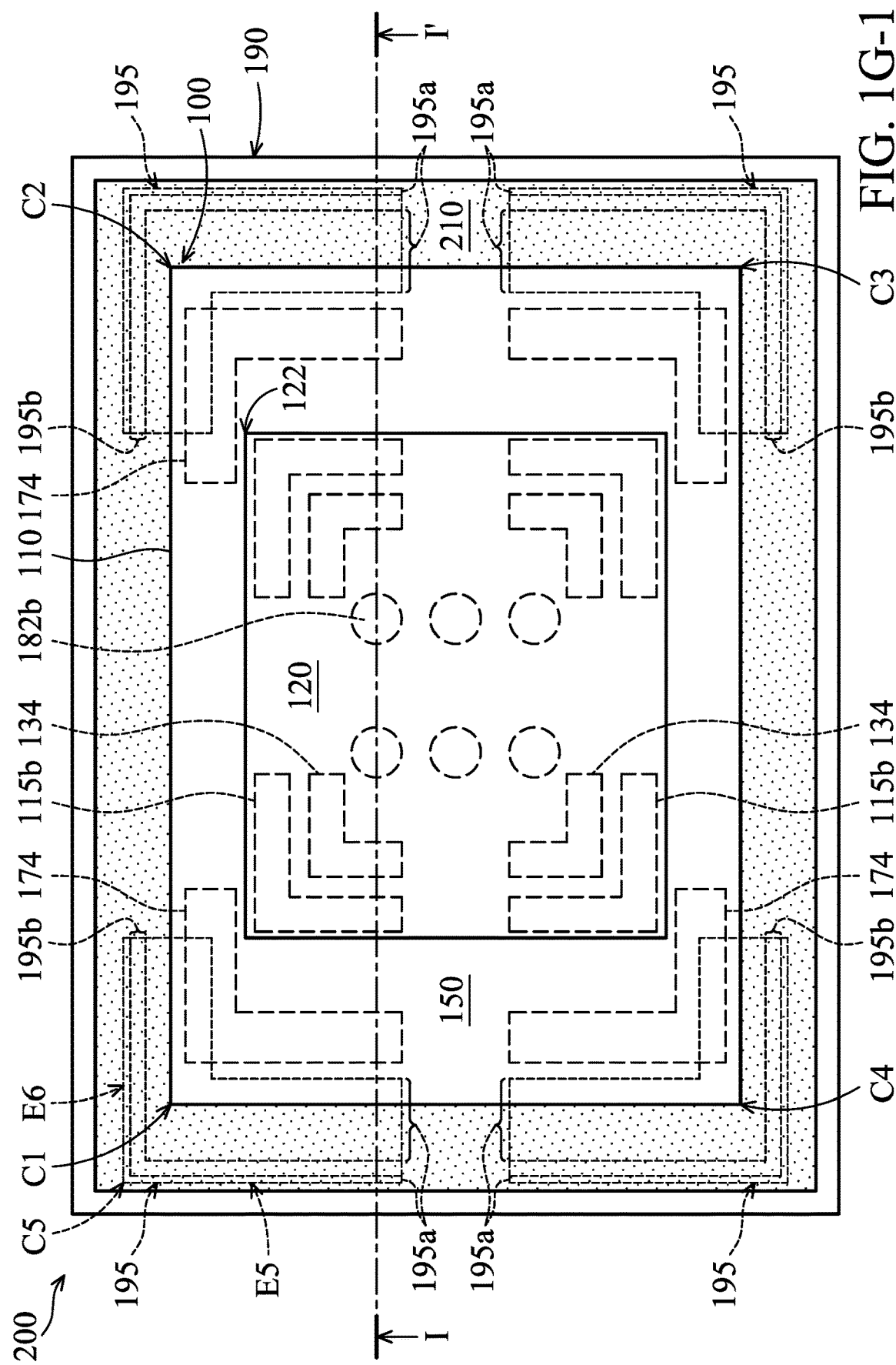

FIG. 1G-1 is a top view of the chip package structure of FIG. 1G, in accordance with some embodiments. FIG. 1G is a cross-sectional view illustrating the chip package structure along a sectional line I-I' in FIG. 1G-1, in accordance with some embodiments. As shown in FIGS. 1G and 1G-1, the chip package structure 100 is flipped upside down, in accordance with some embodiments.

As shown in FIG. 1G, the chip package structure 100 is bonded to a substrate 190 through the solder balls 182b, in accordance with some embodiments. The dummy solder balls 184b are spaced apart from the substrate 190, in accordance with some embodiments. The dummy solder balls 184b and the dummy bumps 174 are electrically insulated from the substrate 190 and the chip 120, in accordance with some embodiments.

The substrate 190 includes a support layer 191, dielectric layers 192, wiring layers 193, pads 194, and dummy structures 195, in accordance with some embodiments. The support layer 191 is made of a semiconductor material, a polymer material, a metal material, or another suitable material, in accordance with some embodiments. The dielectric layers 192, the wiring layers 193, the pads 194, and the dummy structures 195 are over the support layer 191, in accordance with some embodiments. The wiring layers 193 and the pads 194 are in the dielectric layers 192, in accordance with some embodiments. The pads 194 are connected to the wiring layers 193, in accordance with some embodiments.

The dummy structures 195 are electrically insulated from the wiring layers 193, the pads 194, and the substrate 110, in accordance with some embodiments. Each dummy structure 195 includes dummy lines 195a and 195b, in accordance with some embodiments. The dummy lines 195b are over and connected to the dummy lines 195a thereunder, in accordance with some embodiments.

The dummy line 195a is wider than the dummy line 195b, in accordance with some embodiments. The dummy line 195b is close to edges E5 and E6 of the dummy line 195a, in accordance with some embodiments. The edges E5 and E6 meet at a corner C5 of the dummy line 195a, in accordance with some embodiments. The corners C1, C2, C3, and C4 of the substrate 110 overlap the dummy lines 195a, in accordance with some embodiments.

As shown in FIG. 1G-1, the dummy lines 195a and 195b have a substantially same shape, in accordance with some embodiments. As shown in FIG. 1G-1, the dummy lines 195a and 195b surround the corners C1, C2, C3, and C4, in accordance with some embodiments. As shown in FIG. 1G-1, the dummy bumps 174 surround the corners 122, in accordance with some embodiments.

As shown in FIG. 1G, an underfill layer 210 is formed between the substrate s 110 and 190, in accordance with some embodiments. The underfill layer 210 is also referred to as a protective layer, in accordance with some embodiments. In some embodiments, a portion of the underfill layer 210 is formed over the substrate 190 and surrounds the chip package structure 100.

The underfill layer 210 is partially between the dummy bumps 174 (or the dummy solder balls 184b) and the substrate 190, in accordance with some embodiments. The underfill layer 210 is made of an insulating material, such as a polymer material, in accordance with some embodiments. In this step, a chip package structure 200 is substantially formed, in accordance with some embodiments.

Since the stress tends to concentrate at the corners C1, C2, C3, and C4 of the substrate 110 and tends to induce cracks in the dielectric layers 192 and the underfill layer 210 closed to the corners C1, C2, C3, and C4, the dummy structures 195, the dummy bumps 174, and the dummy solder layers 184b are closed to the corners C1, C2, C3, and C4 and are able to stop the cracks, in accordance with some embodiments. Therefore, the dummy structures 195, the dummy bumps 174, and the dummy solder layers 184b prevent the bumps 172 and the solder balls 182b from damage resulting from cracks induced by the stress concentrating at the corners C1, C2, C3, and C4, in accordance with some embodiments. As a result, the dummy structures 195, the dummy bumps 174, and the dummy solder layers 184b improve the yield of the bumps 172 and the solder balls 182b, in accordance with some embodiments.

Figure 2A:
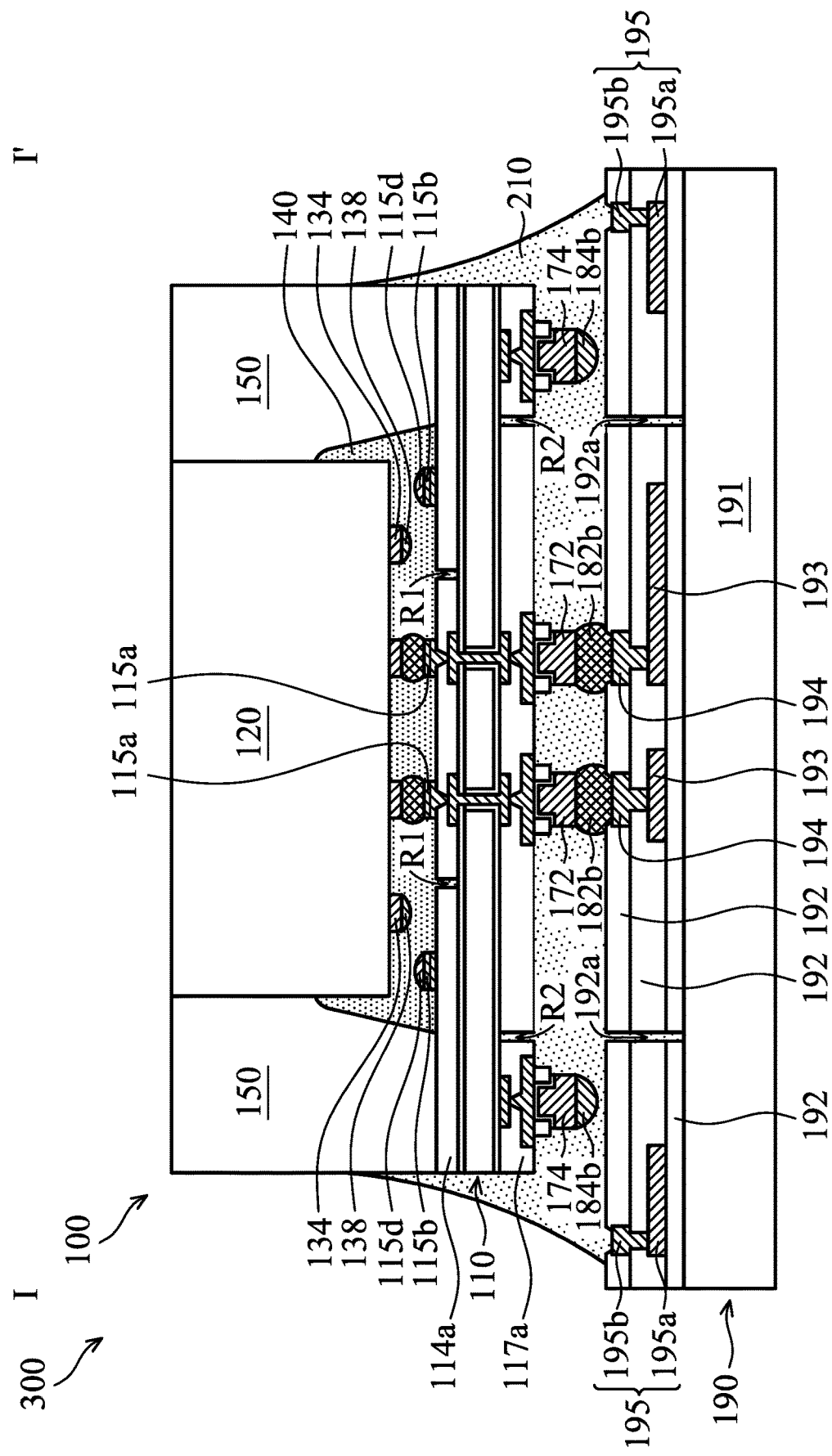
FIG. 2A is a cross-sectional view of a chip package structure, in accordance with some embodiments.

FIG. 2A is a cross-sectional view of a chip package structure 300, in accordance with some embodiments. FIG. 2B is a top view of the chip package structure of FIG. 2A, in accordance with some embodiments. FIG. 2A is a cross-sectional view illustrating the chip package structure along a sectional line I-I' in FIG. 2B, in accordance with some embodiments.

As shown in FIGS. 2A and 2B, the chip package structure 300 is similar to the chip package structure 200 of FIG. 1G, except that the dielectric layers 114a, 117a, and 192 of the chip package structure 300 respectively have trenches R1, R2, and 192a, in accordance with some embodiments. The trenches R1 are filled with the underfill layer 140, in accordance with some embodiments.

As shown in FIG. 2B, the trench R1 is wider than the bump 115a, in accordance with some embodiments. The trenches R2 and 192a are filled with the underfill layer 210, in accordance with some embodiments. As shown in FIG. 2B, the trench R2 or 192a is wider than the bump 172 or the solder ball 182b, in accordance with some embodiments.

The trenches R1 are close to the corners 122 of the chip 120, in accordance with some embodiments. The trenches R1 are able to stop cracks induced by the stress concentrating at the corners 122, in accordance with some embodiments. Therefore, the trenches R1 prevent the bumps 115a from damage resulting from the cracks, in accordance with some embodiments. As a result, the trenches R1 improve the yield of the bumps 115a, in accordance with some embodiments.

The trenches R2 and 192a are close to the corners C1, C2, C3, and C4 of the substrate 110, in accordance with some embodiments. The trenches R2 and 192a are able to stop cracks induced by the stress concentrating at the corners C1, C2, C3, and C4, in accordance with some embodiments. Therefore, the trenches R2 and 192a prevent the bumps 172, the solder balls 182b, and the pads 194 from damage resulting from the cracks, in accordance with some embodiments. As a result, the trenches R2 and 192a improve the yield of the bumps 172, the solder balls 182b, and the pads 194, in accordance with some embodiments.

FIG. 3 is a top view of a chip package structure 400, in accordance with some embodiments. As shown in FIG. 3, the chip package structure 400 is similar to the chip package structure 200 of FIG. 1G-1, except that the dummy bumps 134, 115b, and 174 and the dummy structures 195 of the chip package structure 400 have a U-like shape, in accordance with some embodiments.

Figure 4:
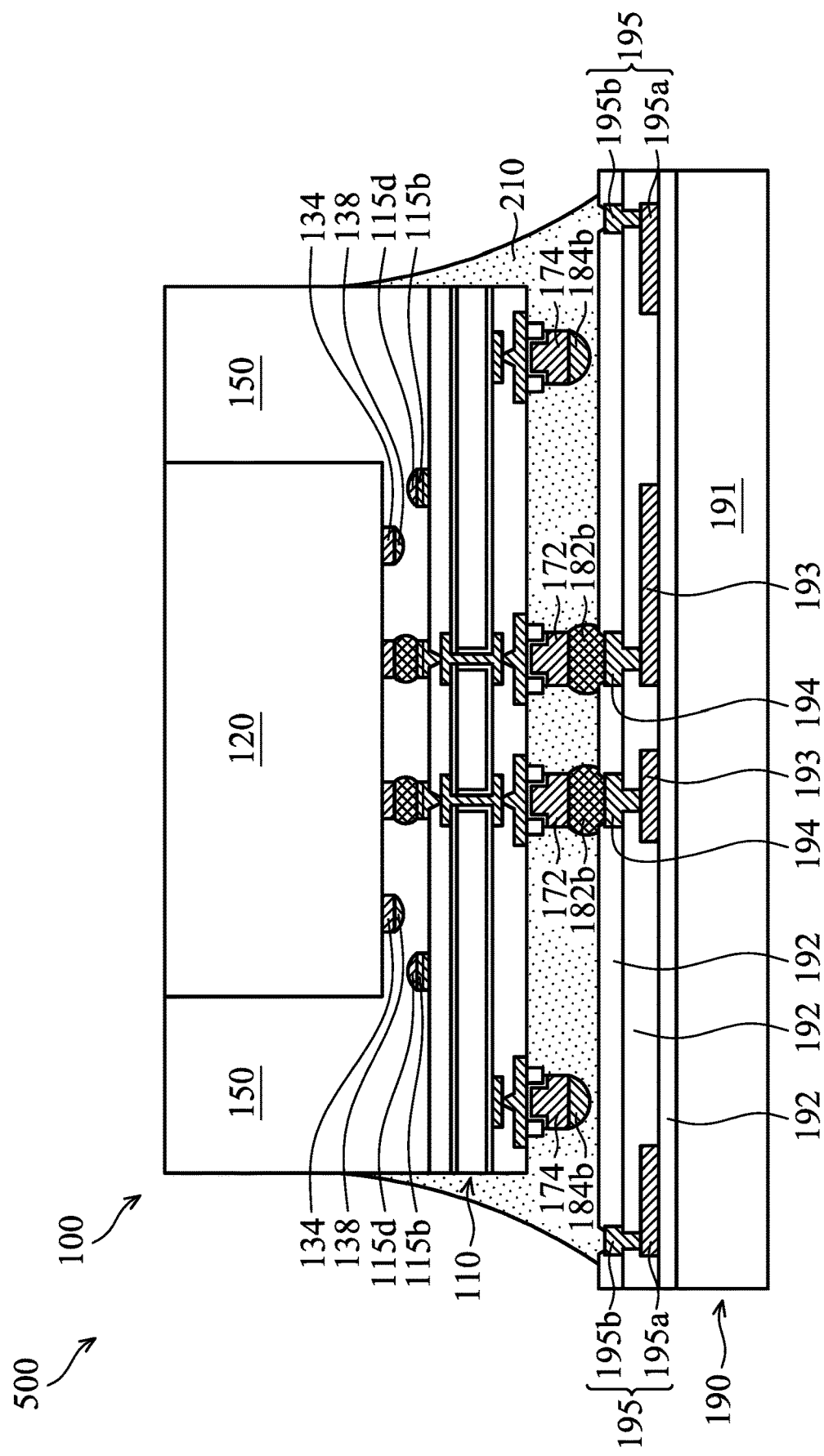
FIG. 4 is a cross-sectional view of a chip package structure, in accordance with some embodiments.

FIG. 4 is a cross-sectional view of a chip package structure 500, in accordance with some embodiments. As shown in FIG. 4, the chip package structure 500 is similar to the chip package structure 200 of FIG. 1G, except that the chip package structure 500 does not have the underfill layer 140, in accordance with some embodiments. The molding layer 150 is partially between the substrate 110 and the chip 120, in accordance with some embodiments.

Figure 5A:
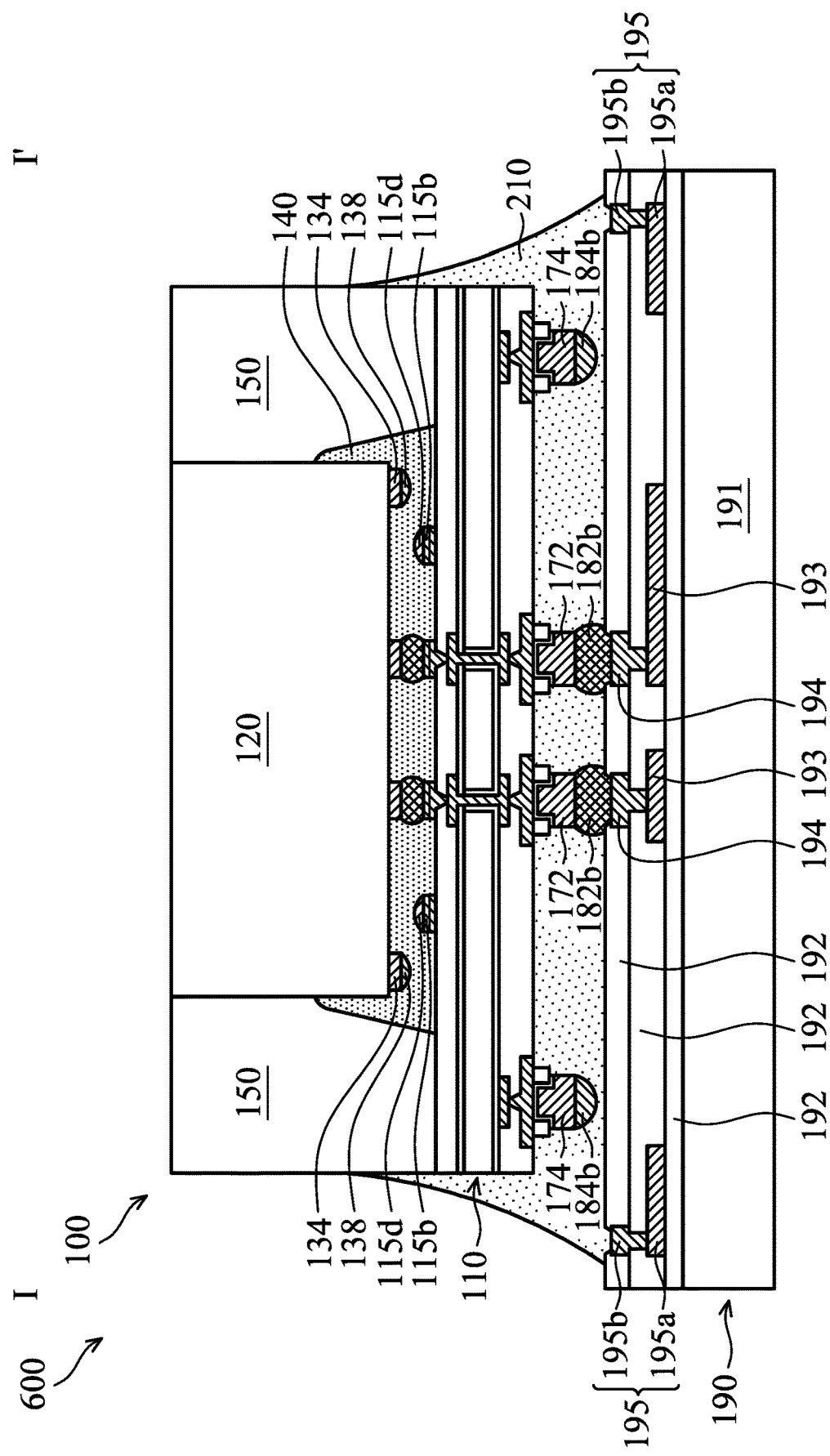
FIG. 5A is a cross-sectional view of a chip package structure, in accordance with some embodiments.
Figure 5B:
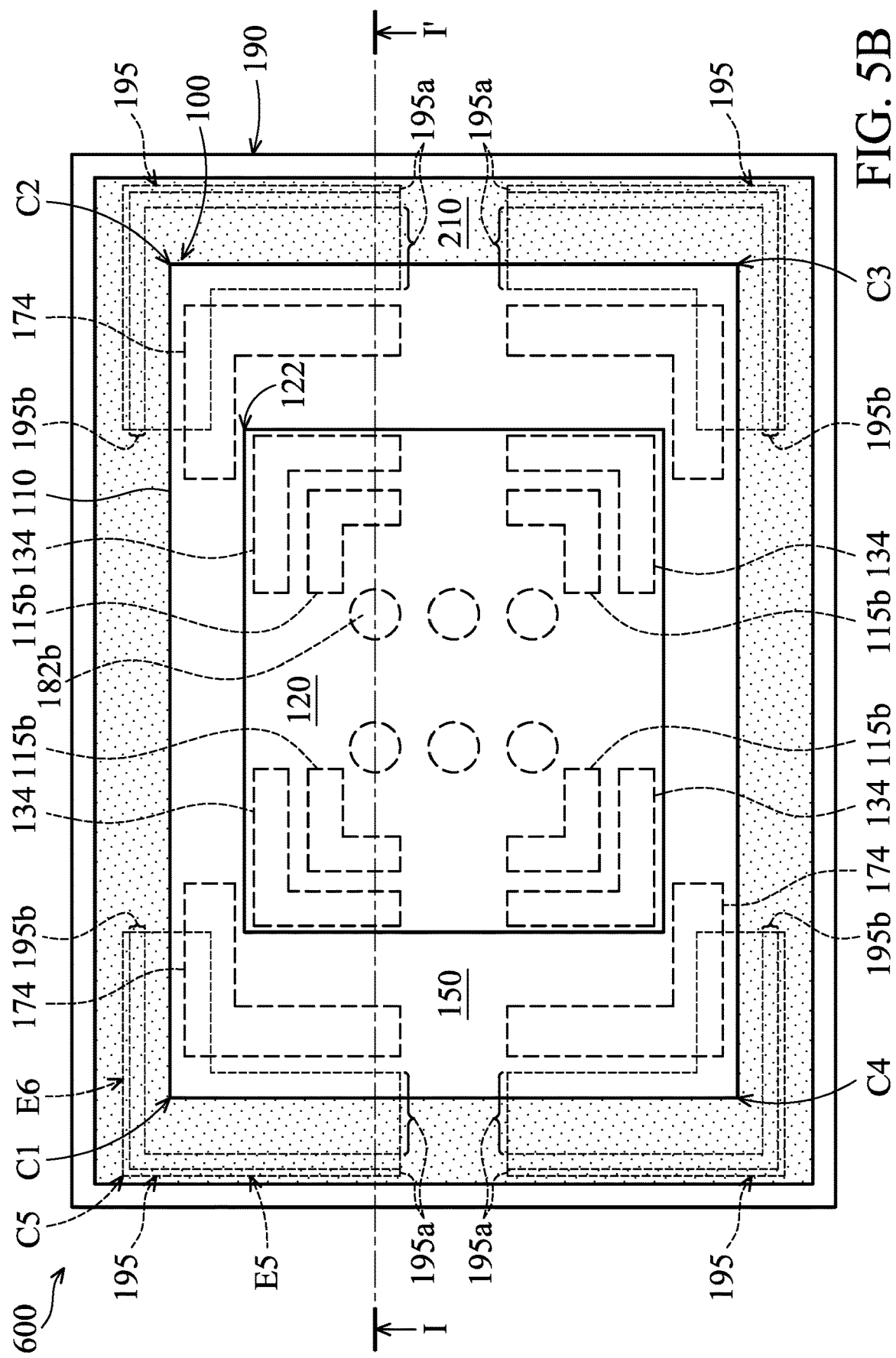
FIG. 5B is a top view of the chip package structure of FIG. 5A, in accordance with some embodiments.

FIG. 5A is a cross-sectional view of a chip package structure 600, in accordance with some embodiments. FIG. 5B is a top view of the chip package structure 600 of FIG. 5A, in accordance with some embodiments. FIG. 5A is a cross-sectional view illustrating the chip package structure 600 along a sectional line I-I' in FIG. 5B, in accordance with some embodiments.

As shown in FIGS. 5A and 5B, the chip package structure 600 is similar to the chip package structure 200 of FIG. 1G, except that the dummy bumps 134 of the chip package structure 600 surround the dummy bumps 115b, in accordance with some embodiments.

Processes and materials for forming the chip package structures 300, 400, 500, and 600 may be similar to, or the same as, those for forming the chip package structure 200 described above.

In accordance with some embodiments, chip package structures and methods for forming the same are provided. The methods (for forming the chip package structure) form a dummy bump over a substrate and close to a corner of the substrate to stop cracks (in an underfill layer under the substrate) resulting from the stress concentrating at the corner.

In accordance with some embodiments, a chip package structure is provided. The chip package structure includes a substrate. The chip package structure includes a chip over the substrate. The chip package structure includes a bump and a first dummy bump between the chip and the substrate. The bump is electrically connected between the chip and the substrate, the first dummy bump is electrically insulated from the substrate, and the first dummy bump is wider than the bump. The chip package structure includes a first dummy solder layer under the first dummy bump and having a curved bottom surface facing and spaced apart from the substrate.

In accordance with some embodiments, a chip package structure is provided. The chip package structure includes a substrate. The chip package structure includes a chip over the substrate. The chip package structure includes a bump and a dummy bump between the chip and the substrate. The bump is electrically connected between the chip and the substrate, the dummy bump is electrically insulated from the substrate, the dummy bump is wider than the bump, the dummy bump has a first strip portion and a second strip portion, and the first strip portion is not parallel to the second strip portion.

In accordance with some embodiments, a chip package structure is provided. The chip package structure includes a package. The chip package structure includes a substrate. The package is over and bonded to the substrate. The substrate includes a redistribution structure including a dielectric structure and a dummy structure in the dielectric structure, the dummy structure is electrically insulated from the package, and the dummy structure has a first L-shape in a top view of the dummy structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
a substrate;
a chip over the substrate;
a bump and a first dummy bump between the chip and the substrate, wherein the bump is electrically connected between the chip and the substrate, the first dummy bump is electrically insulated from the substrate, and the first dummy bump is wider than the bump; and
a first dummy solder layer under the first dummy bump and having a curved bottom surface facing and spaced apart from the substrate.

2. The chip package structure as claimed in claim 1, further comprising:
a solder ball between the bump and the substrate, wherein the solder ball has a planar bottom surface facing the substrate.

3. The chip package structure as claimed in claim 1, wherein the first dummy bump is between the bump and a corner of the chip.

4. The chip package structure as claimed in claim 1, further comprising:
an underfill layer between the chip and the substrate, wherein the underfill layer separates the first dummy solder layer from the substrate.

5. The chip package structure as claimed in claim 1, further comprising:
a second dummy bump between the chip and the substrate, wherein the second dummy bump is connected to the substrate and electrically insulated from the chip; and
a second dummy solder layer over the second dummy bump and electrically insulated from the chip.

6. The chip package structure as claimed in claim 5, wherein the second dummy solder layer has a curved top surface facing and spaced apart from the chip.

7. The chip package structure as claimed in claim 5, wherein the first dummy solder layer and the second dummy solder layer are spaced apart from each other.

8. The chip package structure as claimed in claim 7, further comprising:
an underfill layer between the chip and the substrate, wherein the underfill layer separates the first dummy solder layer from the second dummy solder layer.

9. A chip package structure, comprising:
a substrate;
a chip over the substrate; and
a bump and a dummy bump between the chip and the substrate, wherein the bump is electrically connected between the chip and the substrate, the dummy bump is electrically insulated from the substrate, the dummy bump is wider than the bump, the dummy bump has a first strip portion and a second strip portion, and the first strip portion is not parallel to the second strip portion.

10. The chip package structure as claimed in claim 9, wherein the first strip portion is substantially parallel to a first edge of the chip.

11. The chip package structure as claimed in claim 10, wherein the second strip portion is substantially parallel to a second edge of the chip.

12. The chip package structure as claimed in claim 11, wherein the first edge and the second edge meet at a corner of the chip.

13. The chip package structure as claimed in claim 12, wherein the dummy bump has an L-shape in a top view of the dummy bump.

14. The chip package structure as claimed in claim 12, wherein the dummy bump is between the bump and the corner of the chip.

15. A chip package structure, comprising:
a package comprising a wiring substrate and a chip over the wiring substrate; and
a substrate, wherein the package is over and bonded to the substrate, the substrate comprises a redistribution structure comprising a dielectric structure and a dummy structure in the dielectric structure, the dummy structure is electrically insulated from the package, the dummy structure has a first L-shape in a top view of the package and the substrate, and a first corner of the wiring substrate is between a second corner of the dummy structure and a third corner of the chip in the top view.

16. The chip package structure as claimed in claim 15, wherein the dummy structure has a second L-shape in a cross-sectional view of the dummy structure.

17. The chip package structure as claimed in claim 15, wherein a first edge of the package overlaps the dummy structure.

18. The chip package structure as claimed in claim 17, wherein a second edge of the package overlaps the dummy structure.

19. The chip package structure as claimed in claim 17, wherein the first edge of the package extends across a second edge of the dummy structure in the top view.

20. The chip package structure as claimed in claim 15, wherein a corner of the package overlaps the dummy structure.

* * * * *